United States Patent
Xiang et al.

(10) Patent No.: US 11,919,759 B2
(45) Date of Patent: Mar. 5, 2024

(54) LIQUID-COOLED INTEGRATIVE POWER SYSTEM FOR ELECTRIC FORKLIFT AND CONTROL METHOD THEREOF

(71) Applicant: ANHUI WEIDE POWER SUPPLY CO.,LTD., Anhui (CN)

(72) Inventors: Shounan Xiang, Anhui (CN); Jian Chen, Anhui (CN)

(73) Assignee: ANHUI WEIDE POWER SUPPLY CO.,LTD., Anhui (CN)

( * ) Notice: Subject to any disclaimer, the term of this patent is extended or adjusted under 35 U.S.C. 154(b) by 0 days.

(21) Appl. No.: 17/915,492

(22) PCT Filed: Apr. 16, 2021

(86) PCT No.: PCT/CN2021/087657
§ 371 (c)(1),
(2) Date: Sep. 29, 2022

(87) PCT Pub. No.: WO2022/041783
PCT Pub. Date: Mar. 3, 2022

(65) Prior Publication Data
US 2023/0129714 A1    Apr. 27, 2023

(30) Foreign Application Priority Data
Aug. 27, 2020    (CN) .......................... 202010880702.9

(51) Int. Cl.
*B60K 25/00*    (2006.01)
*B60K 1/00*    (2006.01)
(Continued)

(52) U.S. Cl.
CPC ............ *B66F 9/07572* (2013.01); *B60K 1/00* (2013.01); *B60K 11/02* (2013.01); *B60K 25/00* (2013.01);
(Continued)

(58) Field of Classification Search
CPC  B60K 1/00; B60K 25/00; B60L 1/003; B60L 15/20; B60L 2200/42;
(Continued)

(56) References Cited

U.S. PATENT DOCUMENTS 11,731,501 B2 *    8/2023  Xiang ................ B66F 9/07572
                                                                475/150
2020/0106337 A1    4/2020  Devaraj et al.

FOREIGN PATENT DOCUMENTS

CN         1942633 A  *  4/2007   ............. E02F 9/128
CN       110002370 A  *  7/2019
(Continued)

OTHER PUBLICATIONS

"International Search Report (Form PCT/ISA/210) of PCT/CN2021/087657," dated Jul. 22, 2021, with English translation thereof, pp. 1-5.
(Continued)

*Primary Examiner* — Sherry L Estremsky
(74) *Attorney, Agent, or Firm* — JCIPRNET (57) ABSTRACT

The present invention discloses a liquid-cooled integrative power system for electric forklift and a control method thereof. It includes an integrated transmission gearbox, an integrated motor controller, an oil pump and a vehicle controller. The integrated transmission gearbox includes a drive motor transmission mechanism and an oil pump motor transmission mechanism. The integrated motor controller includes a control unit for a drive motor and a control unit for an oil pump motor. The integrated transmission gearbox, the integrated motor controller, the drive motor, the oil pump motor, the oil pump and the vehicle controller are completely integrated and mounted to form the liquid-cooled
(Continued)

integrative power system for electric forklift. The vehicle controller comprehensively controls the integrative power system.

8 Claims, 6 Drawing Sheets (51) Int. Cl.
  *B60K 11/02*   (2006.01)
  *B60L 1/00*    (2006.01)
  *B60L 15/20*   (2006.01)
  *B66F 9/075*   (2006.01)
  *B66F 9/22*    (2006.01)
  *F15B 15/18*   (2006.01)
  *F16H 37/08*   (2006.01)
  *F16H 57/021*  (2012.01)
  *H02K 7/116*   (2006.01)
  *H02K 9/19*    (2006.01)
  *B62D 5/06*    (2006.01)
  *F16H 57/02*   (2012.01)

(52) U.S. Cl.
  CPC ............ B60L 1/003 (2013.01); B60L 15/20 (2013.01); B66F 9/07568 (2013.01); B66F 9/22 (2013.01); F15B 15/18 (2013.01); F16H 37/0813 (2013.01); F16H 57/021 (2013.01); H02K 7/116 (2013.01); H02K 9/19 (2013.01); *B60K 2001/001* (2013.01); *B60K 2001/006* (2013.01); *B60L 2200/42* (2013.01); *B60L 2240/42* (2013.01); *B60L 2240/486* (2013.01); *B60L 2240/545* (2013.01); *B60L 2240/547* (2013.01); *B60L 2240/549* (2013.01); *B60L 2250/26* (2013.01); *B62D 5/06* (2013.01); *F16H 2057/02034* (2013.01); *F16H 2057/02056* (2013.01)

(58) Field of Classification Search
  CPC ........... B60L 2240/42; B60L 2240/486; B60L 2240/545; B60L 2240/547; B60L 2240/549; B60L 2250/26; F15B 15/18; F16H 37/0813; F16H 57/021; F16H 2057/02034; F16H 2057/02056; F16H 47/02; H02K 7/116; B62D 5/06
  See application file for complete search history.

(56) References Cited

FOREIGN PATENT DOCUMENTS

| CN | 110790195 | 2/2020 |
| CN | 210012549 | 2/2020 |
| CN | 110894053 | 3/2020 |
| CN | 110920369 | 3/2020 |
| CN | 111976470 | 11/2020 |
| WO | WO-2020187972 A1 * | 9/2020 |

OTHER PUBLICATIONS

"Written Opinion of the International Searching Authority (Form PCT/ISA/237) of PCT/CN2021/087657," dated Jul. 22, 2021, pp. 1-5.

* cited by examiner

LIQUID-COOLED INTEGRATIVE POWER SYSTEM FOR ELECTRIC FORKLIFT AND CONTROL METHOD THEREOF

CROSS-REFERENCE TO RELATED APPLICATION

This application is a 371 of international application of PCT application serial no. PCT/CN2021/087657, filed on Apr. 16, 2021, which claims the priority benefit of China application no. 202010880702.9, filed on Aug. 27, 2020. The entirety of each of the above mentioned patent applications is hereby incorporated by reference herein and made a part of this specification.

TECHNICAL FIELD

The present invention relates to the field of electric industrial vehicle technologies, and in particular, to a liquid-cooled integrative power system for electric forklift and a control method thereof.

TECHNICAL BACKGROUND

The industrial vehicle market in China has a broad development space. In particular, an electric forklift market has great potential. With the continuous development of economy, higher requirements are put forward for an electric forklift drive and hydraulic power system.

The existing electric forklift drive and hydraulic power system has a single technical route, in which a walking power unit basically consists of a drive motor and a front axle reducer, a hydraulic power unit consists of an oil pump motor and an oil pump, and a motor control unit consists of a drive motor controller and an oil pump motor controller arranged separately. The whole power system adopts wide-range distributed arrangement, in which the walking power unit is arranged at a front axle of a vehicle body, the hydraulic power unit is arranged in the middle or at the rear of the vehicle body, and the motor control unit is arranged in the middle or at the rear of the vehicle body. In such a system, both the walking power unit and the hydraulic power unit are far away from the motor control unit, and thus the connecting cables are too long, which is not conducive to the assembly of the whole vehicle. Moreover, an excessive length of the cable may increase costs, affect power efficiency, and eventually lead to a significant increase in energy consumption of the vehicle. The drive and hydraulic power system with wide-range distributed arrangement is heat-dissipated complexly and inefficiently, each unit is required to be separately cooled or heat-dissipated, and most are heat-dissipated by natural conduction or forced wind-cooling, resulting in a complex structure, a poor heat-dissipation effect and a significant increase in cost.

Thus, an integrative power system, with a highly integrated structure and capable of realizing integrated arrangement and efficient heat-dissipation, is needed for the electric forklift drive and hydraulic power system, so as to reduce system costs and improve system efficiency.

SUMMARY OF THE INVENTION

In order to overcome the above technical problems, an objective of the present invention is to provide a liquid-cooled integrative power system for electric forklift and a control method thereof.

The objective of the present invention may be achieved through the following technical solutions.

A liquid-cooled integrative power system for electric forklift, including an integrated transmission gearbox, a drive motor, an oil pump motor, an integrated motor controller, an oil pump and a vehicle controller;

the integrated transmission gearbox including a drive motor transmission mechanism and an oil pump motor transmission mechanism; wherein the drive motor transmission mechanism is arranged inside the integrated transmission gearbox, the drive motor transmission mechanism including a plurality of sets of gear shafts arranged in parallel, mating gears on each set of gear shafts engaging with each other, an input gear shaft of the first-stage being provided with a first spline, an output gear shaft of the last-stage being provided with a differential, and each of the gear shafts of the drive motor transmission mechanism being arranged on a housing of the integrated transmission gearbox through a bearing; and wherein the oil pump motor transmission mechanism is arranged inside the integrated transmission gearbox, the oil pump motor transmission mechanism including a plurality of sets of gear shafts arranged in parallel, mating gears on each set of gear shafts engaging with each other, a first input gear shaft and an output gear shaft of the last-stage being respectively provided with a second spline and a third spline, and each of the gear shafts of the oil pump motor transmission mechanism being arranged on the housing of the integrated transmission gearbox through a bearing;

the drive motor being fixed to a lateral side of the integrated transmission gearbox through a mounting bolt on a rear cover of the motor, and an output shaft of the drive motor being connected, through a spline, to the first spline on the input gear shaft of the first-stage on the drive motor transmission mechanism;

the oil pump motor being fixed to a lateral side of the integrated transmission gearbox through a mounting bolt on a rear cover of the motor, and an output shaft of the oil pump motor being connected, through a spline, to the second spline on the input gear shaft of the first-stage on the oil pump motor transmission mechanism;

the integrated motor controller being fixedly mounted to an upper side of the drive motor, the oil pump motor and the integrated transmission gearbox;

the oil pump being fixedly mounted to a lateral side of the integrated transmission gearbox, and an input shaft of the oil pump being connected to, through a spline, the third spline on the output gear shaft of the last-stage on the oil pump motor transmission mechanism;

the vehicle controller being fixedly mounted to an upper cover of the integrated motor controller, and the vehicle controller being electrically connected to the integrated motor controller by wire harness; and the vehicle controller performing a coordinated control on the integrative power system by receiving operation signals and power battery pack states and request signals of the forklift, a specific control method including the following steps:

step 1: receiving, with the vehicle controller, a drive demand signal, a hydraulic operation demand signal, a status of battery pack management system and request signal, and other information from the forklift; the drive demand signal including an accelerator pedal signal, a brake pedal signal, a gear switch signal and other information; the hydraulic operation demand signal including a lift potentiometer signal, a tilt switch signal, a related equipment signal and other information; the status of battery pack management system and request signal including battery state information, temperature information, current and voltage information, discharge rate permission information, and other bus information for a battery pack;

step 2: processing, with the vehicle controller, the drive demand signal, the hydraulic operation demand signal, the status of battery pack management system and request signal, and other information from the forklift, preferentially processing the information about the drive demand signal and the hydraulic operation demand signal received from the forklift according to the status of battery pack management system and request signal and other information, and supplying required power to a drive and hydraulic power system on demand and quantity; outputting, with the vehicle controller, a drive control instruction and a hydraulic control instruction respectively to the integrated motor controller through a low-voltage power supply and a control wire harness according to operating and working states of the forklift, and then performing a coordinated control on a drive motor controller and an oil pump motor controller for current output; and step 3: controlling, with the drive motor controller, the drive motor through a high-voltage connection and a low-voltage connection between the drive motor and the drive motor controller arranged inside a housing of the integrated motor controller; controlling, with the oil pump motor controller, the oil pump motor through a high-voltage connection and a low-voltage connection between the oil pump motor and the oil pump motor controller arranged inside the housing of the integrated motor controller; outputting externally power of the drive motor, as drive power, through the drive motor transmission mechanism, outputting power of the oil pump motor to the oil pump through the oil pump motor transmission mechanism, and outputting, with the oil pump, a high-pressure oil source to a hydraulic operating system; and finally, realizing drive operation and hydraulic steering of the electric forklift and work actions of the electric forklift executed based on hydraulic transmission.

As a further solution of the present invention, the integrated motor controller includes the drive motor controller and the oil pump motor controller; a three-phase terminal of the drive motor controller and a three-phase terminal on the rear cover of the drive motor are directly connected inside the housing of the integrated motor controller through a copper bar; a low-voltage signal terminal of the drive motor controller and a low-voltage signal terminal on the rear cover of the drive motor are directly connected inside the housing of the integrated motor controller through a mating plug-in connector; a three-phase terminal of the oil pump motor controller and a three-phase terminal on the rear cover of the oil pump motor are directly connected inside the housing of the integrated motor controller through a copper bar; and a low-voltage signal terminal of the oil pump motor controller and a low-voltage signal terminal on the rear cover of the oil pump motor are directly connected inside the housing of the integrated motor controller through a mating plug-in connector.

As a further solution of the present invention, a first heat-dissipation water channel is arranged inside a housing of the drive motor, and a first water inlet and a first water outlet of the first heat-dissipation water channel are arranged on the rear cover of the drive motor; a second heat-dissipation water channel is arranged inside a housing of the oil pump motor, a second water outlet of the second heat-dissipation water channel is arranged on the rear cover of the motor, and a second water inlet of the second heat-dissipation water channel is arranged on a front cover of the motor; a third heat-dissipation water channel is arranged at the bottom of the integrated motor controller, and a third water inlet and a third water outlet of the third heat-dissipation water channel are arranged on one side of the integrated motor controller; the third water outlet on one side of the integrated motor controller and the second water inlet on the front cover of the oil pump motor are connected through a first heat-dissipation pipeline, and the second water outlet on the rear cover of the oil pump motor and the first water inlet on the rear cover of the drive motor are connected through a second heat-dissipation pipeline; the third water inlet on one side of the integrated motor controller and a water outlet of an external cooling system are connected through a third heat-dissipation pipeline; and the first water outlet on the rear cover of the drive motor and a water inlet of the external cooling system are connected through a fourth heat-dissipation pipeline.

As a further solution of the present invention, the drive motor transmission mechanism includes a first input shaft, a second shaft, a third shaft and a first output shaft arranged in parallel; the first input shaft, the second shaft, the third shaft and the first output shaft are all fixedly mounted on the housing of the integrated transmission gearbox through bearings; the first input shaft is fixedly connected with an input shaft gear, the second shaft is fixedly connected with a first-stage reduction driven gear and a second-stage reduction driving gear, the third shaft is fixedly connected with a second-stage reduction driven gear and a third-stage reduction driving gear, and the first output shaft is fixedly connected with a third-stage reduction driven gear; the input shaft gear engages the first-stage reduction driven gear in a transmission manner, the second-stage reduction driving gear engages the second-stage reduction driven gear in a transmission manner, and the third-stage reduction driving gear engages the third-stage reduction driven gear in a transmission manner; the first input gear shaft is provided with the first spline, and the first output shaft is provided with the differential.

As a further solution of the present invention, the oil pump motor transmission mechanism includes a second input shaft and a second output shaft arranged in parallel; the second input shaft and the second output shaft are both fixedly mounted on the housing of the integrated transmission gearbox through bearings; the second input shaft is fixedly connected with an input shaft gear, and the second output shaft is fixedly connected with an output shaft gear; the input shaft gear engages the output shaft gear in a transmission manner; and the second input shaft and the second output shaft are respectively provided with the second spline and the third spline.

As a further solution of the present invention, the integrated motor controller is provided with a DC high-voltage positive and negative pole plug-in connector, and a signal plug-in connector of a low-voltage control signal; an upper cover of the integrated motor controller is provided with an overhaul and disassembly cover plate, and a cover-open switch is arranged below the overhaul and disassembly cover plate.

As a further solution of the present invention, the integrated transmission gearbox is provided with a mounting flange plate connected to a drive axle housing of the forklift, and a first bolt hole and a second bolt hole, as two means for assisting in mounting and fixing, connected to a forklift body.

As a further solution of the present invention, a control method for a liquid-cooled integrative power system for electric forklift, including the following steps:

step 1: receiving, with a vehicle controller, a drive demand signal, a hydraulic operation demand signal, a status of battery pack management system and request signal, and other information from the forklift; the drive demand signal including an accelerator pedal signal, a brake pedal signal, a gear switch signal and other information; the hydraulic operation demand signal including a lift potentiometer signal, a tilt switch signal, a related equipment signal and other information; the status of battery pack management system and request signal including battery state information, temperature information, current and voltage information, discharge rate permission information, and other bus information for a battery pack;

step 2: processing, with the vehicle controller, the drive demand signal, the hydraulic operation demand signal, the status of battery pack management system and request signal, and other information from the forklift, preferentially processing the information about the drive demand signal and the hydraulic operation demand signal received from the forklift according to the status of battery pack management system and request signal and other information, and supplying required power to a drive and hydraulic power system on demand and quantity; outputting, with the vehicle controller, a drive control instruction and a hydraulic control instruction respectively to an integrated motor controller through a low-voltage power supply and a control wire harness according to operating and working states of the forklift, and then performing a coordinated control on a drive motor controller and an oil pump motor controller for current output; and step 3: controlling, with the drive motor controller, a drive motor through a high-voltage connection and a low-voltage connection between the drive motor and the drive motor controller arranged inside a housing of the integrated motor controller; controlling, with the oil pump motor controller, an oil pump motor through a high-voltage connection and a low-voltage connection between the oil pump motor and the oil pump motor controller arranged inside the housing of the integrated motor controller; outputting externally power of the drive motor, as drive power, through the drive motor transmission mechanism, outputting power of the oil pump motor to the oil pump through the oil pump motor transmission mechanism, and outputting, with the oil pump, a high-pressure oil source to a hydraulic operating system; and finally, realizing drive operation and hydraulic steering of the electric forklift and work actions of the electric forklift executed based on hydraulic transmission.

The present invention has the following beneficial effects.

According to the present invention, the power system of the electric forklift may be highly integrated, compactly arranged, and completely integrated into a unified whole structure without distributed arrangement, have a simple structure, and facilitate the assembly of the vehicle, which greatly improves the integration and reliability of the power system.

According to the present invention, in an electric forklift drive and hydraulic integrative power system, the external connecting cables between the motor and the motor controller are completely eliminated, with the length of the cables being significantly reduced, so as to reduce resistance caused by the excessive length of the cable and improve operation efficiency of the power system while reducing assembly and mounting procedures. And at the same time, the external connecting cables are eliminated to improve insulation safety and electrical safety performance of the vehicle and prolong the safety operation period of the electric forklift.

According to the present invention, a liquid cooling form of an integrated series water channel is set to perform forced liquid cooling for the motor and the motor controller, which greatly reduces temperature rise of the electric forklift drive and hydraulic integrative power system, improves the reliability of the integrative power system, prolongs the service life, and meets more stringent requirements of the electric forklift.

BRIEF DESCRIPTION OF THE DRAWINGS

The present invention is further described below with reference to the accompanying drawings.

DETAILED DESCRIPTION OF THE EMBODIMENTS

The technical solutions according to the embodiments of the present invention will be described clearly and completely below with reference to the accompanying drawings in the embodiments of the present invention. Apparently, the described embodiments are merely some of rather than all of the embodiments of the present invention. All other embodiments acquired by those skilled in the art without creative efforts based on the embodiments of the present invention shall fall within the protection scope of the present application.

Referring to FIG. 1 to FIG. 8, a liquid-cooled integrative power system for electric forklift and a control method thereof are shown, including an integrated transmission gearbox 1, a drive motor 9, an oil pump motor 6, an integrated motor controller 13, an oil pump 11 and a vehicle controller 2.

Figure 5:
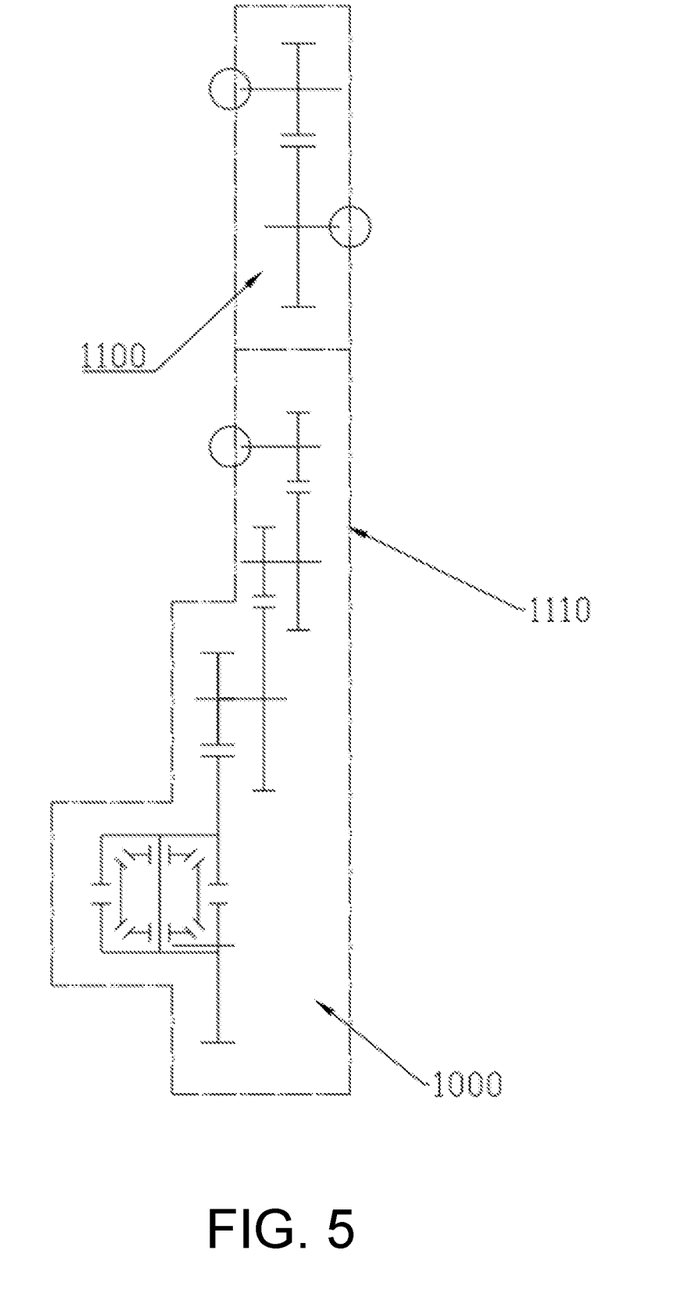
FIG. 5 is a schematic structural diagram of an integrated transmission gearbox according to the present invention.
Figure 6:
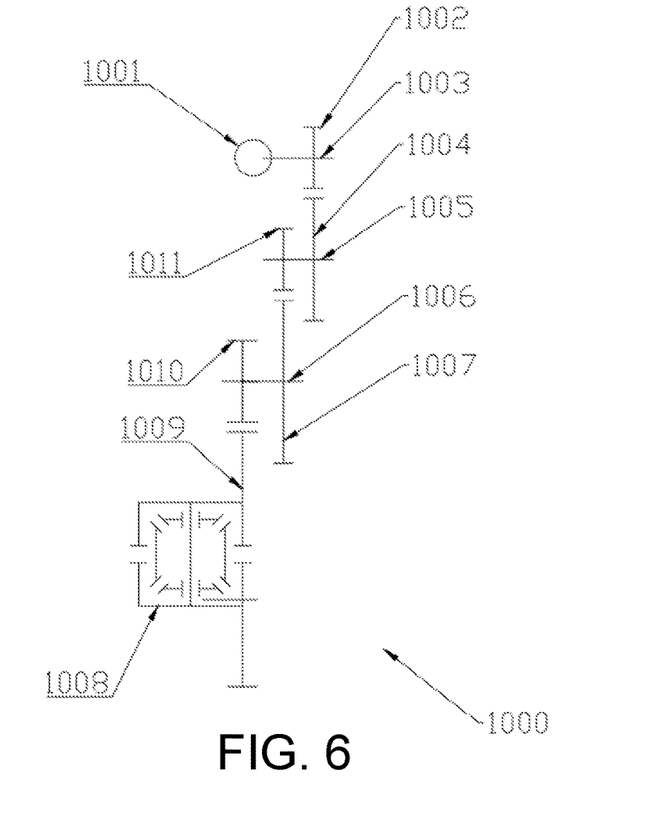
FIG. 6 is a schematic structural diagram of a drive motor transmission mechanism according to the present invention.
Figure 7:
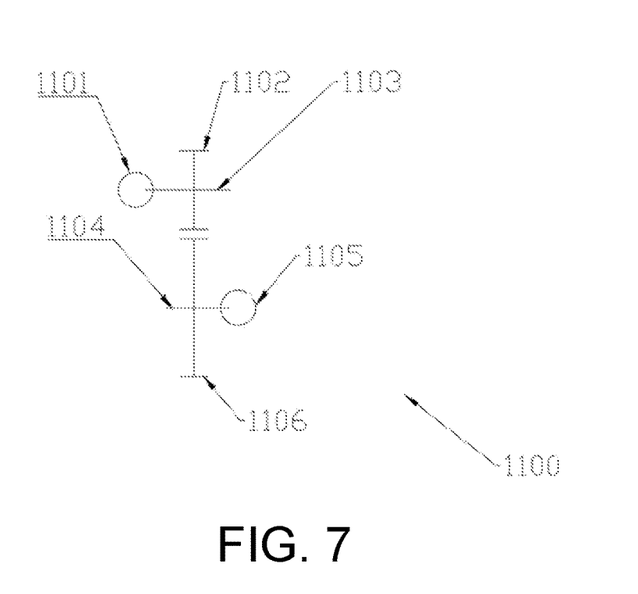
FIG. 7 is a schematic structural diagram of an oil pump motor transmission mechanism according to the present invention.

The integrated transmission gearbox 1 includes a drive motor transmission mechanism 1000 and an oil pump motor transmission mechanism 1100. The drive motor transmission mechanism 1000 is arranged inside the integrated transmission gearbox 1. The drive motor transmission mechanism 1000 includes a plurality of sets of gear shafts arranged in parallel, mating gears on each set of gear shafts engage with each other, a first input gear shaft 1003 of the first-stage is provided with a first spline 1001, an output gear shaft 1009 of the last-stage is provided with a differential 1008, and each gear shaft of the drive motor transmission mechanism 1000 is arranged on a housing 1110 of the integrated transmission gearbox 1 through a bearing. The oil pump motor transmission mechanism 1100 is arranged inside the integrated transmission gearbox 1. The oil pump motor transmission mechanism 1100 includes a plurality of sets of gear shafts arranged in parallel, mating gears on each set of gear shafts engage with each other, a second input gear shaft 1103 of the first-stage and a second output gear shaft 1104 of the last-stage are respectively provided with a second spline 1101 and a third spline 1105, and each gear shaft of the oil pump motor transmission mechanism 1100 is arranged on the housing 1110 of the integrated transmission gearbox 1 through a bearing.

Figure 1:
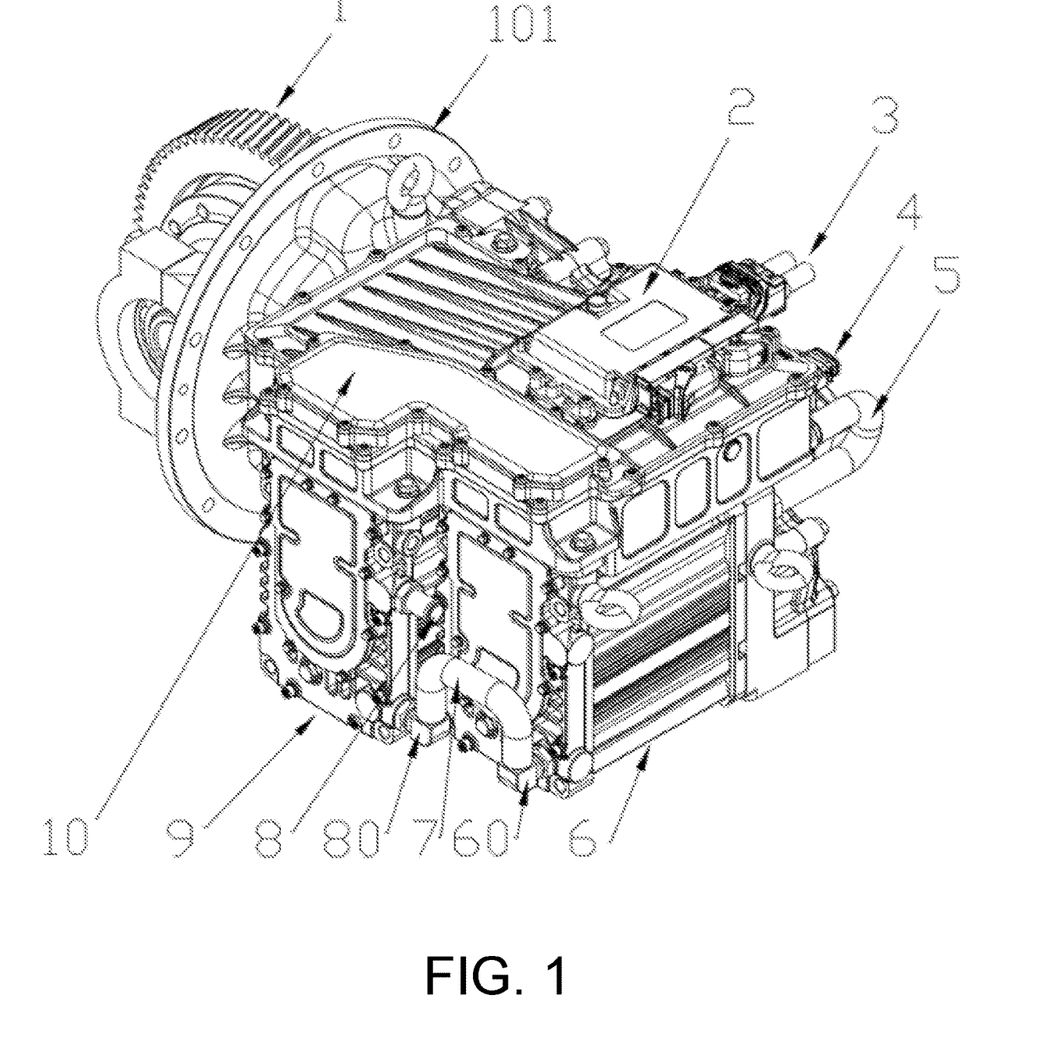
FIG. 1 shows an overall structure of a liquid-cooled integrative power system for electric forklift according to the present invention.

The drive motor 9 is fixed to a lateral side of the integrated transmission gearbox 1 through a mounting bolt on a rear cover of the motor, and an output shaft of the drive motor 9 is connected, through a spline, to the first spline 1001 on the first input gear shaft 1003 of the first-stage on the drive motor transmission mechanism 1000.

The oil pump motor 6 is fixed to a lateral side of the integrated transmission gearbox 1 through a mounting bolt on a rear cover of the motor, and an output shaft of the oil pump motor 6 is connected, through a spline, to the second spline 1101 on the second input gear shaft 1103 of the first-stage on the oil pump motor transmission mechanism 1100.

The integrated motor controller 13 is fixedly mounted to an upper side of the drive motor 9, the oil pump motor 6 and the integrated transmission gearbox 1.

The oil pump 11 is fixedly mounted to a lateral side of the integrated transmission gearbox 1, and an input shaft of the oil pump 11 is connected, through a spline, to the third spline 1105 on the second output gear shaft 1104 of the last-stage on the oil pump motor transmission mechanism 1100.

Figure 8:
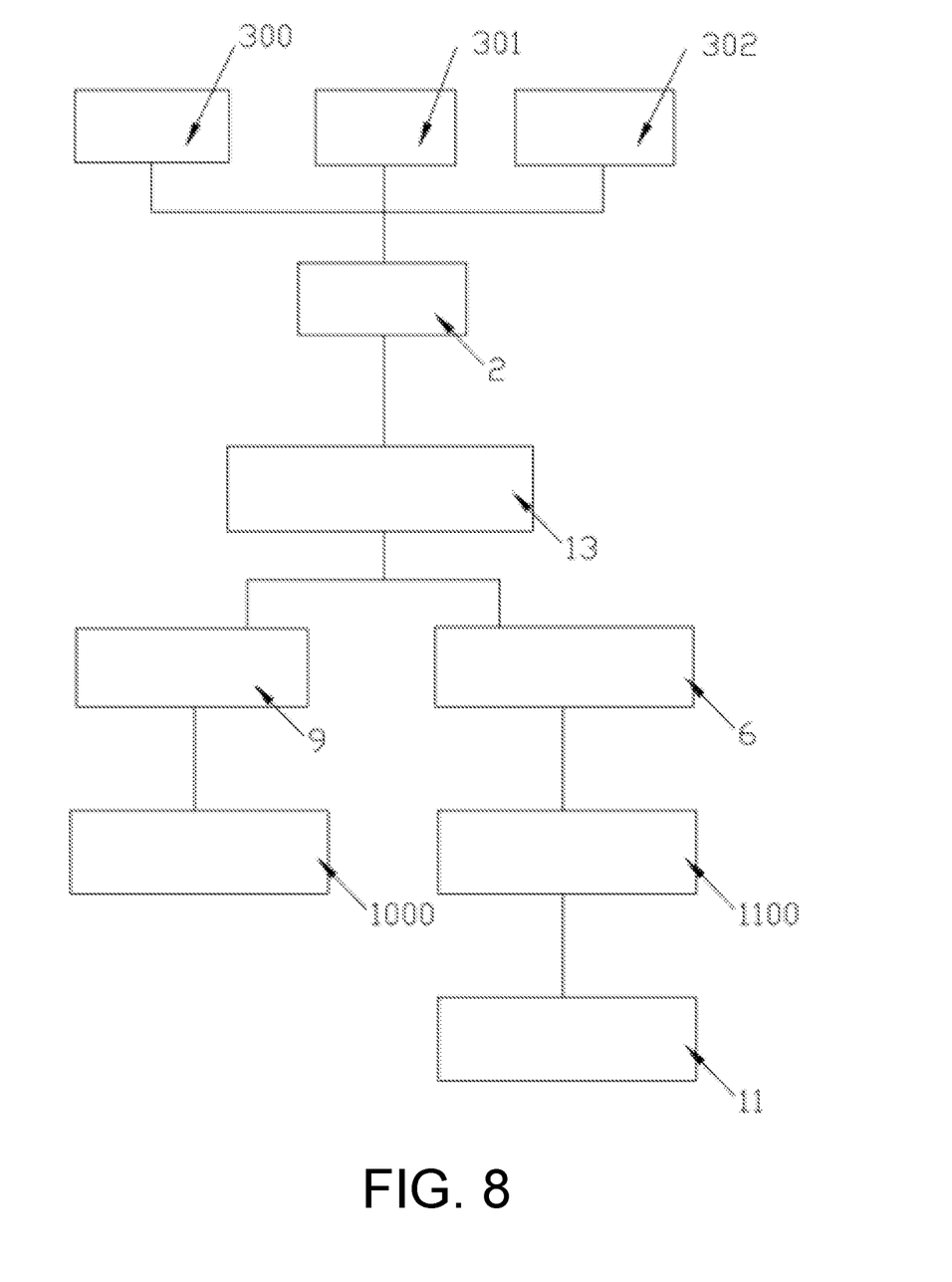
FIG. 8 is a schematic diagram of control execution according to the present invention.

The vehicle controller 2 is fixedly mounted to an upper cover of the integrated motor controller 13, and the vehicle controller 2 is electrically connected to the integrated motor controller 13 by wire harness. The vehicle controller 2 performs a coordinated control on the integrative power system by receiving operation signals and power battery pack states and request signals of the forklift. A specific control method includes the following steps.

In step 1, a vehicle controller 2 receives a drive demand signal 300, a hydraulic operation demand signal 301, a status of battery pack management system and request signal 302, and other information from the forklift. The drive demand signal 300 includes an accelerator pedal signal, a brake pedal signal, a gear switch signal and other information. The hydraulic operation demand signal 301 includes a lift potentiometer signal, a tilt switch signal, a related equipment signal and other information. The status of battery pack management system and request signal 302 includes battery state information, temperature information, current and voltage information, discharge rate permission information, and other bus information for a battery pack.

In step 2, the vehicle controller 2 processes the drive demand signal 300, the hydraulic operation demand signal 301, the status of battery pack management system and request signal 302, and other information from the forklift, preferentially processes the information about the drive demand signal 300 and the hydraulic operation demand signal 301 received from the forklift according to the status of battery pack management system and request signal 302 and other information, and supplies required power to a drive and hydraulic power system on demand and quantity; and the vehicle controller 2 outputs a drive control instruction and a hydraulic control instruction respectively to the integrated motor controller 13 through a low-voltage power supply and a control wire harness according to operating and working states of the forklift, and then performs a coordinated control on a drive motor controller and an oil pump motor controller for current output.

In step 3, the drive motor controller controls the drive motor 9 through a high-voltage connection and a low-voltage connection between the drive motor 9 and the drive motor controller arranged inside a housing of the integrated motor controller 13; the oil pump motor controller controls the oil pump motor 6 through a high-voltage connection and a low-voltage connection between the oil pump motor 6 and the oil pump motor controller arranged inside the housing of the integrated motor controller 13; power of the drive motor 9 is outputted externally through the drive motor transmission mechanism 1000, as drive power; power of the oil pump motor 6 is outputted to the oil pump 11 through the oil pump motor transmission mechanism 1100, and the oil pump 11 outputs a high-pressure oil source to a hydraulic operating system; and thus drive operation and hydraulic steering of the electric forklift and work actions of the electric forklift executed based on hydraulic transmission are finally realized.

The integrated motor controller 13 includes the drive motor controller and the oil pump motor controller 61. A three-phase terminal of the drive motor controller and a three-phase terminal on the rear cover of the drive motor 9 are directly connected inside the housing of the integrated motor controller 13 through a copper bar. A low-voltage signal terminal of the drive motor controller and a low-voltage signal terminal on the rear cover of the drive motor 9 are directly connected inside the housing of the integrated motor controller 13 through a mating plug-in connector. A three-phase terminal of the oil pump motor controller 61 and a three-phase terminal on the rear cover of the oil pump motor 6 are directly connected inside the housing of the integrated motor controller 13 through a copper bar. A low-voltage signal terminal of the oil pump motor controller 61 and a low-voltage signal terminal on the rear cover of the oil pump motor 6 are directly connected inside the housing of the integrated motor controller 13 through a mating plug-in connector.

Figure 2:
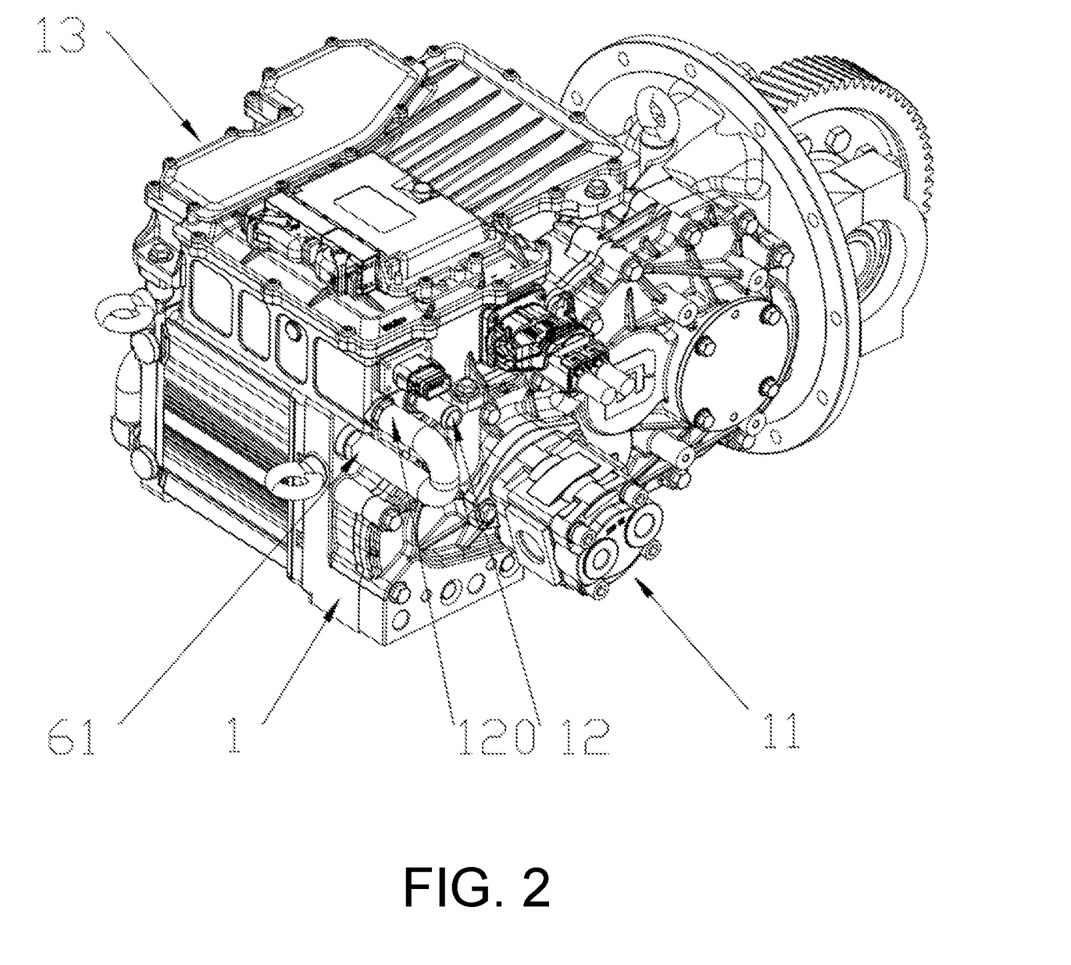
FIG. 2 is an overall schematic diagram of the liquid-cooled integrative power system for electric forklift according to the present invention.
Figure 3:
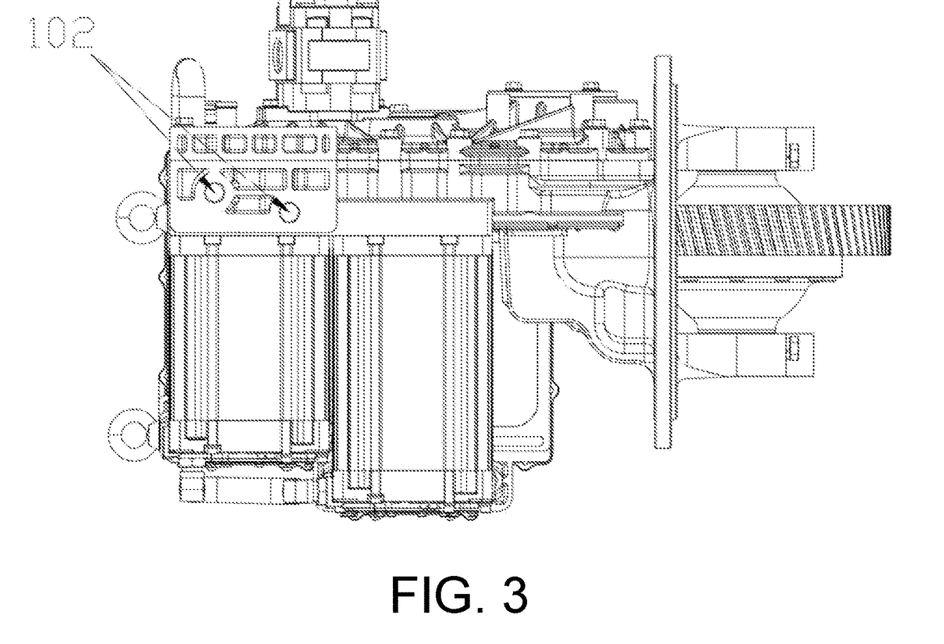
FIG. 3 is an overall bottom view of the liquid-cooled integrative power system for electric forklift according to the present invention.
Figure 4:
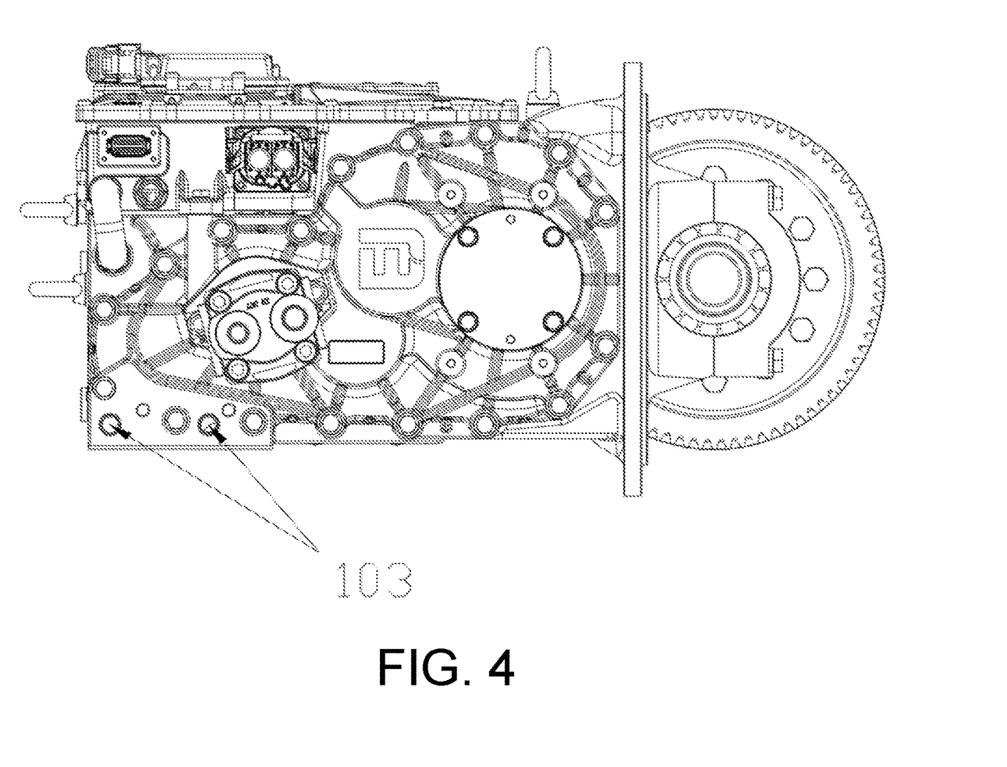
FIG. 4 is an overall side view of the liquid-cooled integrative power system for electric forklift according to the present invention.

A first heat-dissipation water channel is arranged inside a housing of the drive motor 9, and a first water inlet 80 and a first water outlet 8 of the first heat-dissipation water channel are arranged on the rear cover of the drive motor 9. A second heat-dissipation water channel is arranged inside a housing of the oil pump motor 6, a second water outlet 60 of the second heat-dissipation water channel is arranged on the rear cover of the motor 6, and a second water inlet 61 of the second heat-dissipation water channel is arranged on a front cover of the motor 6. A third heat-dissipation water channel is arranged at the bottom of the integrated motor controller 13, and a third water inlet 12 and a third water outlet 120 of the third heat-dissipation water channel are arranged on one side of the integrated motor controller 13. The third water outlet 120 on one side of the integrated motor controller 13 and the second water inlet 61 on the front cover of the oil pump motor 6 are connected through a first heat-dissipation pipeline 5, and the second water outlet 60 on the rear cover of the oil pump motor 6 and the first water inlet 80 on the rear cover of the drive motor 9 are connected through a second heat-dissipation pipeline 7. The third water inlet 12 on one side of the integrated motor controller 13 and a water outlet of an external cooling system are connected through a third heat-dissipation pipeline. The first water outlet 8 on the rear cover of the drive motor 9 and a water inlet of the external cooling system are connected through a fourth heat-dissipation pipeline. In this way, circulation of series heat-dissipation water channels for the motor and the motor controller is formed.

The drive motor transmission mechanism 1000 includes the first input gear shaft 1003, a second shaft 1005, a third shaft 1006 and a first output shaft arranged in parallel. The first input gear shaft 1003, the second shaft 1005, the third shaft 1006 and the first output shaft are all fixedly mounted on the housing 1110 of the integrated transmission gearbox 1 through bearings. The first input gear shaft 1003 is fixedly connected with a input shaft gear 1002, the second shaft 1005 is fixedly connected with a first-stage reduction driven gear 1004 and a second-stage reduction driving gear 1011, the third shaft 1006 is fixedly connected with a second-stage reduction driven gear 1007 and a third-stage reduction driving gear 1010, and the first output shaft is fixedly connected with a third-stage reduction driven gear 1106. The input shaft gear 1002 engages with the first-stage reduction driven gear 1004 in a transmission manner, the second-stage reduction driving gear 1011 engages with the second-stage reduction driven gear 1007 in a transmission manner, and the third-stage reduction driving gear 1010 engages with the third-stage reduction driven gear 1106 in a transmission manner. The first input gear shaft 1003 is provided with the first spline 1001, and the first output shaft is provided with the differential 1008. The oil pump motor transmission mechanism 1100 includes the second input gear shaft 1103 and the second output gear shaft 1104 arranged in parallel. The second input gear shaft 1103 and the second output gear shaft 1104 are both fixedly mounted on the housing 1110 of the integrated transmission gearbox 1 through bearings. The second input gear shaft 1103 is fixedly connected with an input shaft gear 1102, and the second output gear shaft 1104 is fixedly connected with an output shaft gear 1106. The input shaft gear 1102 engages with the output shaft gear 1106 in a transmission manner. The second input gear shaft 1103 and the second output gear shaft 1104 are respectively provided with the second spline 1101 and the third spline 1105. The first input-shaft spline 1001 of the drive motor transmission mechanism 1000 and the second input-shaft spline 1101 of the oil pump motor transmission mechanism 1100 serve as power input interfaces of the integrated transmission gearbox 1. The differential 1008 on the output shaft of the drive motor transmission mechanism 1000 serves as a drive power output interface of the integrated transmission gearbox 1. The third output-shaft spline 1105 of the oil pump motor transmission mechanism 1100 serves as a hydraulic power output interface of the integrated transmission gearbox 1.

The integrated motor controller 13 is provided with a DC high-voltage positive and negative pole plug-in connector 3 and a signal plug-in connector 4 of a low-voltage control signal. An upper cover of the integrated motor controller 13 is provided with an overhaul and disassembly cover plate 10, and a cover-open switch is arranged below the overhaul and disassembly cover plate 10. After the overhaul and disassembly cover plate 10 is opened, the integrated motor controller 13 can be separated from the drive motor 9 and the oil pump motor 6 by simply removing a three-phase harness connecting bolt and a low-voltage control harness connector, which facilitates disassembly. At the same time, with the cover-open switch arranged below the overhaul and disassembly cover plate 10, a high voltage of the system can be cut off during live operation, to ensure electrical safety during the operation.

The integrated transmission gearbox 1 is provided with a mounting flange plate 101 connected to a drive axle housing of the forklift, and a first bolt hole 102 and a second bolt hole 103, as two means for assisting in mounting and fixing, connected to a forklift body. One of the first bolt hole 102 and the second bolt hole 103, as two means for assisting in mounting and fixing, connected to the forklift body, may be selected according to an actual mounting state of the forklift, improving mounting adaptability of the integrative power system.

A control method for a liquid-cooled integrative power system for electric forklift includes the following steps.

In step 1, a vehicle controller 2 receives a drive demand signal 300, a hydraulic operation demand signal 301, a status of battery pack management system and request signal 302, and other information from the forklift. The drive demand signal 300 includes an accelerator pedal signal, a brake pedal signal, a gear switch signal and other information. The hydraulic operation demand signal 301 includes a lift potentiometer signal, a tilt switch signal, a related equipment signal and other information. The status of battery pack management system and request signal 302 includes battery state information, temperature information, current and voltage information, discharge rate permission information, and other bus information for a battery pack.

In step 2, the vehicle controller 2 processes the drive demand signal 300, the hydraulic operation demand signal 301, the status of battery pack management system and request signal 302, and other information from the forklift, preferentially processes the information about the drive demand signal 300 and the hydraulic operation demand signal 301 received from the forklift according to the status of battery pack management system and request signal 302 and other information, and supplies required power to a drive and hydraulic power system on demand and quantity; and the vehicle controller 2 outputs a drive control instruction and a hydraulic control instruction respectively to the integrated motor controller 13 through a low-voltage power supply and a control wire harness according to operating and working states of the forklift, and then performs a coordinated control on a drive motor controller and a oil pump motor controller for current output.

In step 3, the drive motor controller controls the drive motor 9 through a high-voltage connection and a low-voltage connection between the drive motor 9 and the drive motor controller arranged inside a housing of the integrated motor controller 13; the oil pump motor controller controls the oil pump motor 6 through a high-voltage connection and a low-voltage connection between the oil pump motor 6 and the oil pump motor controller arranged inside the housing of the integrated motor controller 13; power of the drive motor 9 is outputted externally through the drive motor transmission mechanism 1000, as drive power; power of the oil pump motor 6 is outputted to the oil pump 11 through the oil pump motor transmission mechanism 1100, and the oil pump 11 outputs a high-pressure oil source to a hydraulic operating system; and thus drive operation and hydraulic steering of the electric forklift and work actions of the electric forklift executed based on hydraulic transmission are finally realized.

The working principle of the present invention is as follows. According to the present invention, the power system of the electric forklift may be highly integrated, compactly arranged, and completely integrated into a unified whole structure without distributed arrangement, have a simple structure, and facilitate the assembly of the vehicle, which greatly improves the integration and reliability of the power system. At the same time, according to the present invention, in an electric forklift drive and hydraulic integrative power system, the external connecting cables between the motor and the motor controller are completely eliminated, the length of the cables is significantly reduced to reduce resistance caused by the excessive length of the cable and improve operation efficiency of the power system while reducing assembly and mounting procedures, and at the same time, the external connecting cables are eliminated to improve insulation safety and electrical safety performance of the vehicle and prolong the safety operation time of the electric forklift. In addition, according to the present invention, a liquid cooling form of an integrated series water channel is set to perform forced liquid cooling for the motor and the motor controller, which greatly reduces temperature rise of the electric forklift drive and hydraulic integrative power system, improves the reliability of the integrative power system, prolongs the service life, and meets more stringent requirements of the electric forklift.

In the description of the present specification, reference throughout this specification to "an embodiment", "example", "specific example" and the like means that a particular feature, structure, material, or characteristic described in connection with the embodiment or example is included in at least one embodiment or example of the present invention. In the specification, the schematic expressions to the above-mentioned terms are not necessarily referring to the same embodiment or example. Furthermore, the described particular features, structures, materials, or characteristics may be combined in any suitable manner in one or more embodiments or examples.

The above contents are only examples and illustrations of the present invention. Various modifications, supplements or alternatives in a similar way may be made to the particularly described embodiments by those skilled in the art, which may fall within the protection scope of the present application provided that such modifications, supplements or alternatives do not depart from the present invention and go beyond the scope defined in the appended claims.

What is claimed is:

1. A liquid-cooled integrative power system for electric forklift, comprising an integrated transmission gearbox, a drive motor, an oil pump motor, an integrated motor controller, an oil pump and a vehicle controller;

the integrated transmission gearbox comprising a drive motor transmission mechanism and an oil pump motor transmission mechanism; the drive motor transmission mechanism being arranged inside the integrated transmission gearbox, the drive motor transmission mechanism comprising a plurality of sets of gear shafts arranged in parallel, mating gears on each set of gear shafts engaging with each other, a first input gear shaft being provided with a first spline, a first output gear shaft being provided with a differential, and each of the gear shafts of the drive motor transmission mechanism being arranged on a housing of the integrated transmission gearbox through a bearing; the oil pump motor transmission mechanism being arranged inside the integrated transmission gearbox, the oil pump motor transmission mechanism comprising a plurality of sets of gear shafts arranged in parallel, mating gears on each set of gear shafts engaging with each other, a second input gear shaft and a second output gear shaft being respectively provided with a second spline and a third spline, and each gear shaft of the oil pump motor transmission mechanism being arranged on the housing of the integrated transmission gearbox through a bearing;

the drive motor being fixed to a lateral side of the integrated transmission gearbox through a mounting bolt on a rear cover of the motor, and an output shaft of the drive motor being connected, through a spline, to the first spline on the first input gear shaft on the drive motor transmission mechanism;

the oil pump motor being fixed to a lateral side of the integrated transmission gearbox through a mounting bolt on a rear cover of the motor, and an output shaft of the oil pump motor being connected, through a spline, to the second spline on the second input gear shaft on the oil pump motor transmission mechanism;

the integrated motor controller being fixedly mounted to an upper side of the drive motor, the oil pump motor and the integrated transmission gearbox;

the oil pump being fixedly mounted to a lateral side of the integrated transmission gearbox, and an input shaft of the oil pump being connected, through a spline, to the third spline on the second output gear shaft on the oil pump motor transmission mechanism; and the vehicle controller being fixedly mounted to an upper cover of the integrated motor controller, and the vehicle controller being electrically connected to the integrated motor controller by wire harness; and the vehicle controller performing a coordinated control on the integrative power system by receiving operation signals and power battery pack states and request signals of the forklift, a specific control method comprising the following steps:

step 1: receiving, with the vehicle controller, a drive demand signal, a hydraulic operation demand signal, a status of battery pack management system and request signal, and other information from the forklift; the drive demand signal comprising an accelerator pedal signal, a brake pedal signal, a gear switch signal and other information; the hydraulic operation demand signal comprising a lift potentiometer signal, a tilt switch signal, a related equipment signal and other information; the status of battery pack management system and request signal comprising battery state information, temperature information, current and voltage information, discharge rate permission information, and other bus information for a battery pack;

step 2: processing, with the vehicle controller, the drive demand signal, the hydraulic operation demand signal, the status of battery pack management system and request signal, and other information from the forklift, processing the information about the drive demand signal and the hydraulic operation demand signal received from the forklift according to the status of battery pack management system and request signal and other information, and supplying required power to a drive and hydraulic power system based on demand and quantity; outputting, with the vehicle controller, a drive control instruction and a hydraulic control instruction respectively to the integrated motor controller through a low-voltage power supply and a control wire harness according to operating and working states of the forklift, and then performing a coordinated control on a drive motor controller and an oil pump motor controller for current output; and step 3: controlling, with the drive motor controller, the drive motor through a high-voltage connection and a low-voltage connection between the drive motor and the drive motor controller arranged inside a housing of the integrated motor controller; controlling, with the oil pump motor controller, the oil pump motor through a high-voltage connection and a low-voltage connection between the oil pump motor and the oil pump motor controller arranged inside the housing of the integrated motor controller; outputting externally power of the drive motor, as drive power, through the drive motor transmission mechanism, outputting power of the oil pump motor to the oil pump through the oil pump motor transmission mechanism, and outputting, with the oil pump, a high-pressure oil source to a hydraulic operating system; and finally, realizing drive operation and hydraulic steering of the electric forklift and work actions of the electric forklift executed based on hydraulic transmission.

2. The liquid-cooled integrative power system for electric forklift according to claim 1, wherein the integrated motor controller comprises the drive motor controller and the oil pump motor controller; a three-phase terminal of the drive motor controller and a three-phase terminal on the rear cover of the drive motor are directly connected inside the housing of the integrated motor controller through a copper bar; a low-voltage signal terminal of the drive motor controller and a low-voltage signal terminal on the rear cover of the drive motor are directly connected inside the housing of the integrated motor controller through a mating plug-in connector; a three-phase terminal of the oil pump motor controller and a three-phase terminal on the rear cover of the oil pump motor are directly connected inside the housing of the integrated motor controller through a copper bar; and a low-voltage signal terminal of the oil pump motor controller and a low-voltage signal terminal on the rear cover of the oil pump motor are directly connected inside the housing of the integrated motor controller through a mating plug-in connector.

3. The liquid-cooled integrative power system for electric forklift according to claim 1, wherein a first heat-dissipation water channel is arranged inside a housing of the drive motor, and a first water inlet and a first water outlet of the first heat-dissipation water channel are arranged on the rear cover of the drive motor; a second heat-dissipation water channel is arranged inside a housing of the oil pump motor, a second water outlet of the second heat-dissipation water channel is arranged on the rear cover of the motor, and a second water inlet of the second heat-dissipation water channel is arranged on a front cover of the motor; a third heat-dissipation water channel is arranged at the bottom of the integrated motor controller, and a third water inlet and a third water outlet of the third heat-dissipation water channel are arranged on one side of the integrated motor controller; the third water outlet on one side of the integrated motor controller and the second water inlet on the front cover of the oil pump motor are connected through a first heat-dissipation pipeline, and the second water outlet on the rear cover of the oil pump motor and the first water inlet on the rear cover of the drive motor are connected through a second heat-dissipation pipeline; the third water inlet on one side of the integrated motor controller and a water outlet of an external cooling system are connected through a third heat-dissipation pipeline; and the first water outlet on the rear cover of the drive motor and a water inlet of the external cooling system are connected through a fourth heat-dissipation pipeline.

4. The liquid-cooled integrative power system for electric forklift according to claim 1, wherein the drive motor transmission mechanism comprises the first input gear shaft, a second shaft, a third shaft and a first output shaft arranged in parallel; the first input gear shaft, the second shaft, the third shaft and the first output shaft are all fixedly mounted on the housing of the integrated transmission gearbox through bearings; the first input gear shaft is fixedly connected with an input shaft gear, the second shaft is fixedly connected with a first-stage reduction driven gear and a second-stage reduction driving gear, the third shaft is fixedly connected with a second-stage reduction driven gear and a third-stage reduction driving gear, and the first output shaft is fixedly connected with a third-stage reduction driven gear; the input shaft gear engages the first-stage reduction driven gear in a transmission manner, the second-stage reduction driving gear engages the second-stage reduction driven gear in a transmission manner, and the third-stage reduction driving gear engages the third-stage reduction driven gear in a transmission manner; the first input gear shaft is provided with the first spline, and the first output shaft is provided with the differential.

5. The liquid-cooled integrative power system for electric forklift according to claim 1, wherein the oil pump motor transmission mechanism comprises the second input gear shaft and the second output gear shaft arranged in parallel; the second input gear shaft and the second output gear shaft are both fixedly mounted on the housing of the integrated transmission gearbox through bearings; the second input gear shaft is fixedly connected with an input shaft gear, and the second output gear shaft is fixedly connected with an output shaft gear; the input shaft gear engages the output shaft gear in a transmission manner; and the second input gear shaft and the second output gear shaft are respectively provided with the second spline and the third spline.

6. The liquid-cooled integrative power system for electric forklift according to claim 1, wherein the integrated motor controller is provided with a DC high-voltage positive and negative pole plug-in connector and a signal plug-in connector of a low-voltage control signal; the upper cover of the integrated motor controller is provided with an overhaul and disassembly cover plate, and a cover-open switch is arranged below the overhaul and disassembly cover plate.

7. The liquid-cooled integrative power system for electric forklift according to claim 1, wherein the integrated transmission gearbox is provided with a mounting flange plate connected to a drive axle housing of the forklift, and a first bolt hole and a second bolt hole, as two means for assisting in mounting and fixing, connected to a forklift body.

8. A control method for a liquid-cooled integrative power system for electric forklift, comprising the following steps:

step 1: receiving, with a vehicle controller, a drive demand signal, a hydraulic operation demand signal, a status of battery pack management system and request signal, and other information from the forklift; the drive demand signal comprising an accelerator pedal signal, a brake pedal signal, a gear switch signal and other information; the hydraulic operation demand signal comprising a lift potentiometer signal, a tilt switch signal, a related equipment signal and other information; the status of battery pack management system and request signal comprising battery state information, temperature information, current and voltage information, discharge rate permission information, and other bus information for a battery pack;

step 2: processing, with the vehicle controller, the drive demand signal, the hydraulic operation demand signal, the status of battery pack management system and request signal, and other information from the forklift, processing the information about the drive demand signal and the hydraulic operation demand signal received from the forklift according to the status of battery pack management system and request signal and other information, and supplying required power to a drive and hydraulic power system based on demand and quantity; outputting, with the vehicle controller, a drive control instruction and a hydraulic control instruction respectively to an integrated motor controller through a low-voltage power supply and a control wire harness according to operating and working states of the forklift, and then performing a coordinated control on a drive motor controller and an oil pump motor controller for current output; and step 3: controlling, with the drive motor controller, a drive motor through a high-voltage connection and a low-voltage connection between the drive motor and the drive motor controller arranged inside a housing of the integrated motor controller; controlling, with the oil pump motor controller, an oil pump motor through a high-voltage connection and a low-voltage connection between the oil pump motor and the oil pump motor controller arranged inside the housing of the integrated motor controller; outputting externally power of the drive motor, as drive power, through a drive motor transmission mechanism, outputting power of the oil pump motor to an oil pump through an oil pump motor transmission mechanism, and outputting, with the oil pump, a high-pressure oil source to a hydraulic operating system; and finally, realizing drive operation and hydraulic steering of the electric forklift and work actions of the electric forklift executed based on hydraulic transmission.

\* \* \* \* \*